United States Patent
Sun et al.

(10) Patent No.: US 12,219,825 B2
(45) Date of Patent: Feb. 4, 2025

(54) DISPLAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventors: Yanliu Sun, Beijing (CN); Pengxia Liang, Beijing (CN); Ge Shi, Beijing (CN); Jiahui Han, Beijing (CN); Xue Dong, Beijing (CN); Shiyu Zhang, Beijing (CN); Yujie Liu, Beijing (CN); Song Yang, Beijing (CN); Yuyao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 555 days.

(21) Appl. No.: 17/612,958

(22) PCT Filed: Feb. 9, 2021

(86) PCT No.: PCT/CN2021/076256
§ 371 (c)(1),
(2) Date: Nov. 19, 2021

(87) PCT Pub. No.: WO2022/170479
PCT Pub. Date: Aug. 18, 2022

(65) Prior Publication Data
US 2022/0359631 A1    Nov. 10, 2022

(51) Int. Cl.
*H01L 27/32* (2006.01)
*H01L 51/52* (2006.01)
(Continued)

(52) U.S. Cl.
CPC ......... *H10K 59/124* (2023.02); *H10K 50/813* (2023.02); *H10K 50/856* (2023.02);
(Continued)

(58) Field of Classification Search
CPC .. H10K 50/813; H10K 50/822; H10K 50/856; H10K 59/80515; H10K 59/80521; H10K 59/878
See application file for complete search history.

(56) References Cited

U.S. PATENT DOCUMENTS

2011/0140138 A1    1/2011  Ko et al.
2015/0372251 A1   12/2015  Fujii
(Continued)

FOREIGN PATENT DOCUMENTS

| CN | 104795434 A | 7/2015 |
| CN | 104867961 A | 8/2015 |

(Continued)

OTHER PUBLICATIONS

Machine translation, Zhao, Chinese Pat. Pub. No. CN111900267A, translation date: May 28, 2024, Clarivate Analytics, all pages. (Year: 2024).*

(Continued)

*Primary Examiner* — Victoria K. Hall
(74) *Attorney, Agent, or Firm* — MUNCY, GEISSLER, OLDS & LOWE, P.C.

(57) ABSTRACT

A display substrate includes sub-pixels on a base substrate and each including a sub-pixel aperture area, a reflective layer, an insulating layer, independent anode patterns, a light-emitting function layer and a cathode. An orthographic projection of the reflective layer onto the base substrate at least partially overlaps an orthographic projection of the sub-pixel aperture area onto the base substrate. Each of orthographic projections of the anode patterns onto the base substrate at least partially overlaps the orthographic projection of the sub-pixel aperture area onto the base substrate. An orthographic projection of the light-emitting function layer onto the base substrate is within the orthographic projection of the sub-pixel aperture area onto the base substrate. An orthographic projection of the cathode onto the base substrate covers the orthographic projection of the light-emitting function layer onto the base substrate.

20 Claims, 3 Drawing Sheets

(51) Int. Cl.
　　　*H01L 51/56* (2006.01)
　　　*H10K 50/813* (2023.01)
　　　*H10K 50/856* (2023.01)
　　　*H10K 59/124* (2023.01)
　　　*H10K 59/80* (2023.01)
　　　*H10K 71/00* (2023.01)
　　　*H10K 59/12* (2023.01)
　　　*H10K 59/122* (2023.01)
　　　*H10K 102/00* (2023.01)

(52) U.S. Cl.
　　　CPC ..... *H10K 59/80515* (2023.02); *H10K 59/878* (2023.02); *H10K 71/00* (2023.02); *H10K 59/1201* (2023.02); *H10K 59/122* (2023.02); *H10K 2102/351* (2023.02)

(56) References Cited

U.S. PATENT DOCUMENTS

| | | |
|---|---|---|
| 2016/0315131 A1 | 10/2016 | Li et al. |
| 2017/0084572 A1 | 3/2017 | Liu et al. |
| 2017/0084875 A1* | 3/2017 | Joung .................. H10K 50/85 |
| 2017/0133620 A1 | 5/2017 | Lee et al. |
| 2018/0331165 A1 | 11/2018 | Li |
| 2023/0247890 A1* | 8/2023 | Zhao ................ H10K 59/80516 257/72 |

FOREIGN PATENT DOCUMENTS

| | | | | |
|---|---|---|---|---|
| CN | 106992198 A | | 7/2017 | |
| CN | 107146808 A | | 9/2017 | |
| CN | 109273619 A | | 1/2019 | |
| CN | 110246883 A | | 9/2019 | |
| CN | 111192912 A | | 5/2020 | |
| CN | 111403463 A | | 7/2020 | |
| CN | 111403628 A | | 7/2020 | |
| CN | 111554828 A | | 8/2020 | |
| CN | 111900267 A | * | 11/2020 | ........... H10K 50/818 |
| CN | 215008277 U | * | 12/2021 | ......... H01L 27/3258 |
| KR | 101035356 B1 | | 5/2011 | |
| KR | 20160083588 A | | 7/2016 | |

OTHER PUBLICATIONS

Machine translation, Zhang, Chinese Pat. Pub. No. CN215008277U, translation date: May 28, 2024, Clarivate Analytics, all pages. (Year: 2024).*

* cited by examiner

-Prior Art-

FIG. 4 first direction

DISPLAY SUBSTRATE AND METHOD FOR MANUFACTURING THE SAME, AND DISPLAY DEVICE

CROSS-REFERENCE TO RELATED APPLICATION

This application is the U.S. national phase of PCT Application No. PCT/CN2021/076256 filed on Feb. 9, 2021, the entire contents of all of which are hereby incorporated by reference.

TECHNICAL FIELD

The present disclosure relates to the field of display technology, and in particular to a display substrate and a method for manufacturing the same, and a display device.

BACKGROUND

Organic light-emitting diode (OLED) display screens are widely used in various fields due to their advantages such as lighter and thinner, high brightness, low power consumption, fast response, high definition, good flexibility, and high luminous efficiency. In an existing OLED display screen, an anode generally adopts a laminated multilayer structure, and an orthographic projection of sub-pixel aperture areas in the OLED display screen onto a base substrate is located within an orthographic projection of the anode onto the base substrate.

SUMMARY

One purpose of the present disclosure is to provide a display substrate, a method for manufacturing the same, and a display device.

In order to achieve the above purpose, the present disclosure provides the following technical solutions.

According to a first aspect of the present disclosure, a display substrate is provided and includes: a base substrate; and a plurality of sub-pixels on the base substrate. The sub-pixel includes a sub-pixel aperture area; the sub-pixel further includes:
  a reflective layer, wherein an orthographic projection of the reflective layer onto the base substrate at least partially overlaps an orthographic projection of the sub-pixel aperture area onto the base substrate;
  an insulating layer on one side of the reflective layer away from the base substrate;
  a plurality of anode patterns independent of each other, wherein the plurality of anode patterns are on one side of the insulating layer away from the base substrate, and each of orthographic projections of the plurality of anode patterns onto the base substrate at least partially overlaps the orthographic projection of the sub-pixel aperture area onto the base substrate;
  a light-emitting function layer on one side of the plurality of anode patterns away from the base substrate, wherein an orthographic projection of the light-emitting function layer onto the base substrate at least partially overlaps the orthographic projection of the sub-pixel aperture area onto the base substrate; and
  a cathode on one side of the light-emitting function layer away from the base substrate, wherein an orthographic projection of the cathode onto the base substrate covers the orthographic projection of the light-emitting function layer onto the base substrate; an orthographic projection of a first portion of the cathode onto the base substrate is located within the orthographic projection of the sub-pixel aperture area onto the base substrate; there is a segment difference in a surface of the first portion away from the base substrate; in a direction perpendicular to the base substrate, a height of the segment difference is less than or equal to a thickness of the anode pattern.

Optionally, a thickness D1 of the anode pattern in the direction perpendicular to the base substrate satisfies: 100 Å≤D1≤1200 Å.

Optionally, the plurality of anode patterns in the sub-pixel are arranged along a first direction; and a shortest distance H between two adjacent sides of adjacent anode patterns satisfies: 0.5 μm≤H≤1.5 μm.

Optionally, the anode pattern is a single-layer structure, and the anode pattern is made of indium tin oxide.

Optionally, the insulating layer includes a transparent insulating layer.

Optionally, the insulating layer is made of an inorganic material.

Optionally, a thickness D2 of the insulating layer in a direction perpendicular to the base substrate satisfies: 200 Å≤D2≤1500 Å.

Optionally, the sub-pixel further includes a bonding layer, and the bonding layer is between the reflective layer and the base substrate.

Optionally, the sub-pixel further includes a protection layer, and the protection layer is between the reflective layer and the insulating layer.

Optionally, the bonding layer, the protection layer and the anode pattern are made of the same material.

Optionally, the sub-pixel further includes: a hole injection layer, a hole transport layer, an electron transport layer and an electron injection layer which are sequentially stacked in a direction away from the base substrate;
  wherein the hole injection layer and the hole transport layer are both located between the light-emitting function layer and the plurality of anode patterns; and the electron transport layer and the electron injection layer are both located between the light-emitting function layer and the cathode.

Optionally, the sub-pixel further includes a driving circuit; the driving circuit is between the plurality of anode patterns and the base substrate; and the driving circuit is configured to provide driving signals for the plurality of anode patterns, respectively.

Optionally, the driving circuit includes a plurality of driving sub-circuits corresponding to the plurality of anode patterns in a one-to-one manner; the driving sub-circuit is coupled to the corresponding anode pattern through a via-hole structure, and is configured to provide a driving signal for the corresponding anode pattern.

Optionally, the driving circuit includes driving sub-circuits and a plurality of control sub-circuits respectively coupled to the driving sub-circuits; the plurality of control sub-circuits are corresponding to the plurality of anode patterns in a one-to-one manner; each control sub-circuit is coupled to the corresponding anode pattern through the corresponding via-hole structure; the plurality of control sub-circuits turn on electrical connection between the driving sub-circuits and the corresponding anode patterns in a time-sharing manner.

Optionally, the display substrate further includes a pixel defining layer; the pixel defining layer is located at one side of the anode pattern away from the base substrate; the pixel defining layer defines a plurality of sub-pixel aperture areas;

an orthographic projection of the pixel defining layer onto the base substrate at least partially overlaps an orthographic projection of the via-hole structure onto the base substrate.

Optionally, the pixel defining layer includes a first defining portion and a second defining portion; an orthographic projection of the first defining portion onto the base substrate at least partially overlaps the orthographic projection of the via-hole structure onto the base substrate; an orthographic projection of the second defining portion onto the base substrate does not overlap the orthographic projection of the via-hole structure onto the base substrate;

the orthographic projection of the cathode onto the base substrate does not overlap the orthographic projection of the first defining portion onto the base substrate; and the orthographic projection of the cathode onto the base substrate at least partially overlaps the orthographic projection of the second defining portion onto the base substrate.

Optionally, the reflective layer is located between the driving circuit and the pixel defining layer.

Optionally, the via-hole structure extends through the insulating layer; and the orthographic projection of the via-hole structure onto the base substrate does not overlap the orthographic projection of the reflective layer onto the base substrate.

Optionally, the via-hole structures corresponding to the plurality of anode patterns are arranged along a first direction.

Based on the technical solution of the display substrate, according to a second aspect of the present disclosure, a display device is provided and includes the foregoing display substrate.

Based on the technical solution of the display substrate, according to a third aspect of the present disclosure, a method for manufacturing a display substrate is provided and includes: fabricating a plurality of sub-pixels on a base substrate, wherein the sub-pixel includes a sub-pixel aperture area. The step of fabricating the plurality of sub-pixels specifically includes:

fabricating a reflective layer, wherein an orthographic projection of the reflective layer onto the base substrate at least partially overlaps an orthographic projection of the sub-pixel aperture area onto the base substrate;

fabricating an insulating layer on one side of the reflective layer away from the base substrate;

fabricating a plurality of anode patterns independent of each other, wherein the plurality of anode patterns are on one side of the insulating layer away from the base substrate, an orthographic projection of each anode pattern onto the base substrate at least partially overlaps the orthographic projection of the sub-pixel aperture area onto the base substrate;

fabricating a light-emitting function layer, wherein the light-emitting function layer is on one side of the anode patterns away from the base substrate, and an orthographic projection of the light-emitting function layer onto the base substrate at least partially overlaps the orthographic projection of the sub-pixel aperture area onto the base substrate; and fabricating a cathode on one side of the light-emitting function layer away from the base substrate; wherein an orthographic projection of the cathode onto the base substrate covers the orthographic projection of the light-emitting function layer onto the base substrate, an orthographic projection of a first portion of the cathode onto the base substrate coincides with the orthographic projection of the sub-pixel aperture area onto the base substrate; there is a segment difference in a surface of the first portion away from the base substrate; in a direction perpendicular to the base substrate, a height of the segment difference is less than or equal to a thickness of the anode pattern.

Optionally, the step of fabricating a plurality of anode patterns independent of each other, specifically includes:

fabricating an anode transition layer; and using a dry etching process to etch the anode transition layer to form a plurality of anode patterns independent of each other.

BRIEF DESCRIPTION OF THE DRAWINGS

The drawings described herein are used to provide a better understanding of the present disclosure and constitute a part of the present disclosure. The exemplary embodiments of the present disclosure and their descriptions are used to illustrate the present disclosure, and do not constitute an improper limitation of the present disclosure. Wherein.

DETAILED DESCRIPTION

In order to further illustrate a display substrate and a method for manufacturing the same, and a display device provided in the embodiments of the present disclosure, a detailed description is given hereinafter in conjunction with the accompanying drawings of the specification.

Figure 1:
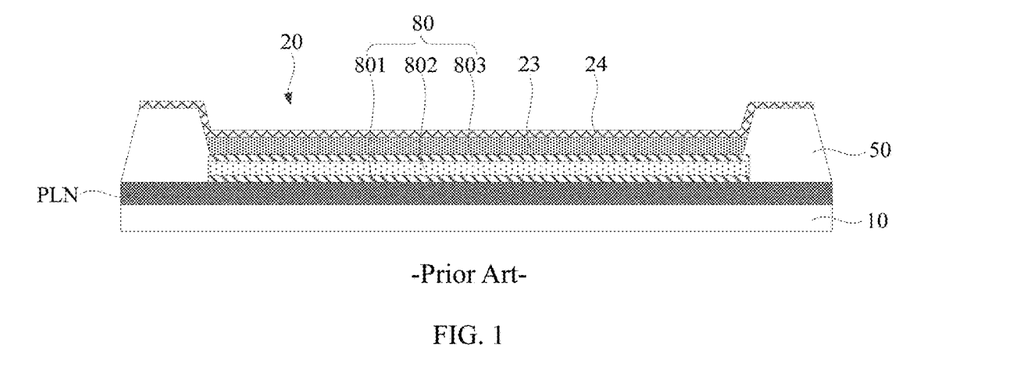
FIG. 1 is a schematic cross-sectional view of a sub-pixel in the related art.

As shown in FIG. 1 which is a schematic diagram of a sub-pixel in an existing OLED display screen, an anode 80 includes a laminated multilayer structure (for example, a first anode layer 801, a second anode layer 802 and a third anode layer 803). An orthographic projection of a sub-pixel aperture area 20 onto a base substrate 10 is located within an orthographic projection of the anode 80 onto the base substrate. That is, the anode 80 can cover a bottom of the sub-pixel aperture area.

The OLED display screen with the foregoing sub-pixel structure cannot meet requirements for displaying multiple viewpoints in 3D.

In view of the foregoing problem, it has been discovered through research that a sub-pixel can be subdivided into multiple independent sub-subpixels to meet the requirements for displaying multiple viewpoints in 3D. This not only meets the requirements for displaying multiple viewpoints in 3D, but also ensures a high-resolution 3D display effect, so that a resolution of 3D display will not be reduced compared with 2D display.

Figure 2:
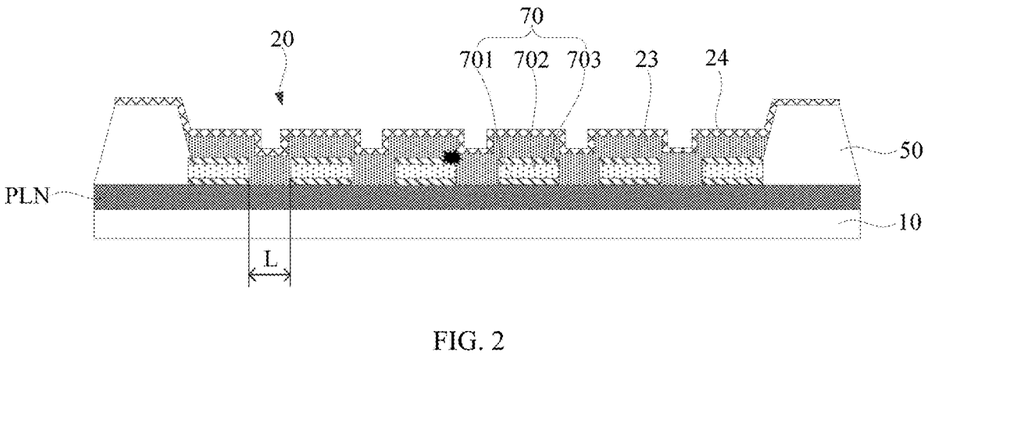
FIG. 2 is a first schematic cross-sectional view of a sub-pixel according to an embodiment of the present disclosure.

Specifically, the present disclosure provides a display substrate. FIG. 2 shows structures of a sub-pixel in the display substrate. An anode in each sub-pixel is divided into a plurality of independent anode units 70 (including a first anode pattern 701, a second anode pattern 702 and a third anode pattern 703). The plurality of anode units 70 can be independently driven. Each anode unit 70 correspondingly forms a sub-subpixel.

For example, the anode unit includes an indium tin oxide (ITO) pattern, an argentum (Ag) pattern, and an indium tin oxide pattern that are stacked.

It can be seen that in the display substrate provided in the present disclosure, the sub-pixel is subdivided into sub-subpixels, that is, one sub-pixel is subdivided into multiple sub-subpixels which can be independently controlled, thereby achieving independent grayscale control for the multiple sub-subpixels. The display substrate provided in the present disclosure not only meets the requirements for displaying multiple viewpoints in 3D, but also ensures a high-resolution 3D display effect, so that a resolution of 3D display will not be reduced compared with 2D display.

However, in the foregoing display substrate, a space area is formed between adjacent sub-subpixels, so that a segment difference in a direction perpendicular to the base substrate is formed between the anode unit and its surrounding space area and a height of the segment difference is about 1100 Å. This leads to risks of leakage or short-circuiting (i.e., a black spot shown in FIG. 2) between an edge of the anode unit and a cathode, which affects the yield of display products. Especially for blue sub-pixels, a thickness of blue organic light-emitting material layer included in the blue sub-pixel is substantially about 1200 Å, resulting in a very small distance, about 100 Å, between the cathode and the anode unit at an edge of the segment difference, which easily causes leakage and short-circuiting.

Figure 3:
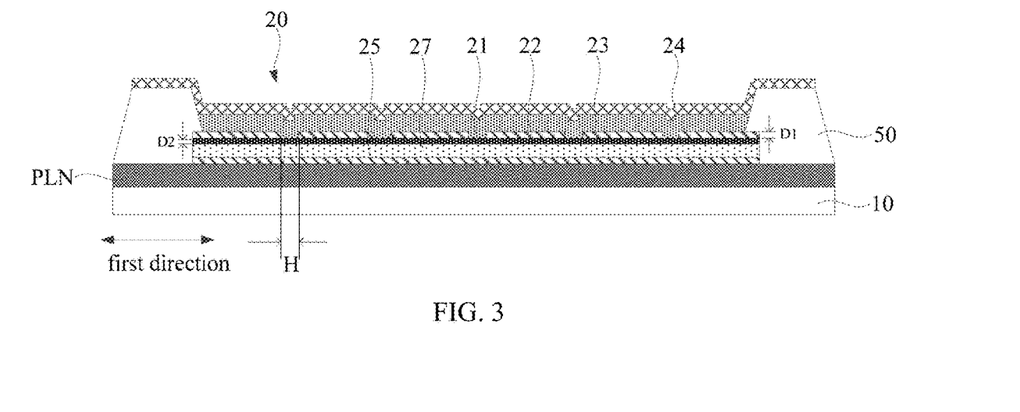
FIG. 3 is a second schematic cross-sectional view of a sub-pixel according to an embodiment of the present disclosure.

Referring to FIG. 3, one embodiment of the present disclosure provides a display substrate, including: a base substrate 10, and a plurality of sub-pixels on the base substrate 10. The sub-pixel includes a sub-pixel aperture area 20. The sub-pixel further includes:

a reflective layer 27, where an orthographic projection of the reflective layer 27 onto the base substrate 10 at least partially overlaps an orthographic projection of the sub-pixel aperture area 20 onto the base substrate 10;

an insulating layer 21 on one side of the reflective layer 27 away from the base substrate 10;

a plurality of anode patterns 22 independent of each other, where the plurality of anode patterns 22 are on one side of the insulating layer 21 away from the base substrate 10, and each of orthographic projections of the plurality of anode patterns 22 onto the base substrate 10 at least partially overlaps the orthographic projection of the sub-pixel aperture area 20 onto the base substrate 10;

a light-emitting function layer 23 on one side of the plurality of anode patterns 22 away from the base substrate 10, where an orthographic projection of the light-emitting function layer 23 onto the base substrate 10 at least partially overlaps the orthographic projection of the sub-pixel aperture area 20 onto the base substrate 10;

a cathode 24 on one side of the light-emitting function layer 23 away from the base substrate 10, where an orthographic projection of the cathode 24 onto the base substrate 10 covers the orthographic projection of the light-emitting function layer 23 onto the base substrate 10; an orthographic projection of a first portion of the cathode 24 onto the base substrate 10 is located within the orthographic projection of the sub-pixel aperture area 20 onto the base substrate 10; there is a segment difference in a surface of the first portion away from the base substrate 10; in a direction perpendicular to the base substrate 10, a height of the segment difference is less than or equal to a thickness of the anode pattern 22.

For example, the base substrate 10 includes a flexible substrate or a rigid substrate. For example, the base substrate 10 includes a glass substrate.

For example, the sub-pixels include multiple red sub-pixels, multiple green sub-pixels, and multiple blue sub-pixels. For example, each sub-pixel includes a sub-pixel aperture area 20. The sub-pixel aperture area 20 is used to accommodate a corresponding light-emitting function layer 23. For example, each sub-pixel aperture area 20 accommodates the light-emitting function layer 23 that emits light rays of one color.

For example, the reflective layer 27 is made of a metal material, such as metallic silver. For example, the orthographic projection of the sub-pixel aperture area 20 onto the base substrate 10 is located within the orthographic projection of the reflective layer 27 onto the base substrate 10. For example, the orthographic projection of the sub-pixel aperture area 20 onto the base substrate 10 is surrounded by the orthographic projection of the reflective layer 27 onto the base substrate 10.

For example, the insulating layer 21 includes a passivation layer. For example, the insulating layer 21 completely covers the reflective layer 27, and the insulating layer 21 can insulate the reflective layer 27 from the plurality of anode patterns 22. For example, the orthographic projection of the sub-pixel aperture area 20 onto the base substrate 10 is located within the orthographic projection of the insulating layer 21 onto the base substrate 10. For example, the orthographic projection of the sub-pixel aperture area 20 onto the base substrate 10 is surrounded by the orthographic projection of the insulating layer 21 onto the base substrate 10.

For example, the plurality of anode patterns 22 are made of the same material, and the plurality of anode patterns 22 can be formed simultaneously in a patterning process. For example, the anode pattern 22 is a single-layer pattern made of a single material. For example, the plurality of anode patterns 22 are arranged along a first direction. For example, the plurality of anode patterns 22 are distributed in an array. For example, the plurality of anode patterns 22 are uniformly distributed. For example, a space area is formed between adjacent anode patterns 22. A height of the segment difference formed between each anode pattern 22 and its surrounding space area, is related to a thickness of the anode pattern 22 in a direction perpendicular to the base substrate 10.

For example, each of orthographic projections of the plurality of anode patterns 22 onto the base substrate 10 overlaps the orthographic projections of the sub-pixel aperture areas 20 onto the base substrate 10. For example, orthographic projections of a part of the plurality of anode patterns 22 onto the base substrate 10 are located within the orthographic projection of the sub-pixel aperture area 20 onto the base substrate 10, and orthographic projections of other part of the plurality of anode patterns 22 onto the base substrate 10 partially overlaps the orthographic projection of the sub-pixel aperture area 20 onto the base substrate 10.

For example, each anode pattern 22 is corresponding to one sub-subpixel.

For example, the light-emitting function layer 23 is made of an organic light-emitting material. For example, the orthographic projection of the light-emitting function layer 23 onto the base substrate 10 at least partially overlaps the orthographic projection of the sub-pixel aperture area 20 onto the base substrate 10. For example, the orthographic projection of the light-emitting function layer 23 onto the base substrate 10 is located within the orthographic projection of the sub-pixel aperture area 20 onto the base substrate 10. For example, the light-emitting function layer 23 covers at least a part of each of the anode patterns 22 and is filled in the space area between adjacent anode patterns 22.

For example, the cathode 24 is an entire-layer structure covering each sub-pixel aperture area 20. For example, the cathode 24 is made of a metal material.

For example, the cathode 24 includes a first portion and a second portion. An orthographic projection of the first portion onto the base substrate 10 is located within the orthographic projection of the sub-pixel aperture area 20 onto the base substrate 10. An orthographic projection of the second portion onto the base substrate overlaps an orthographic projection of a pixel defining layer in the display substrate onto the base substrate 10.

For example, the orthographic projection of the first portion onto the base substrate does not overlap the orthographic projection of the pixel defining layer onto the base substrate.

By providing the segment difference in the surface of the first portion away from the base substrate 10 and enabling the height of the segment difference to be less than or equal to the thickness of the anode pattern 22 in the direction perpendicular to the base substrate 10, a distance between an edge portion of the anode pattern 22 and the cathode 24 can be increased, thereby greatly reducing the risk of leakage or short-circuiting between the edge portion of the anode pattern 22 and the cathode 24.

In the display substrate provided in the embodiment of the present disclosure, the sub-pixel includes the reflective layer 27, the insulating layer 21 and the plurality of anode patterns 22, and each of the reflective layer 27 and the insulating layer 21 is an entire-layer structure under the plurality of anode patterns 22, so that the height of the segment difference between each anode pattern 22 and the space area is only related to the thickness of the anode pattern 22, and has nothing to do with the thickness of the insulating layer 21 and the reflective layer 27, thereby greatly reducing the height of the segment difference. In this way, a part of the light-emitting function layer 23 filled in the space area is reduced, and a thickness of another part of the light-emitting function layer 23 covering the edge portion of the anode pattern 22 is increased, thereby effectively increasing the distance between the edge portion of the anode pattern 22 and the cathode 24, and then greatly reducing the risk of leakage or short-circuiting between the edge portion of the anode pattern 22 and the cathode.

Further, the display substrate provided in the embodiment of the present disclosure effectively improves flatness of one side of the plurality of anode patterns 22 away from the base substrate 10 by greatly reducing the height of the segment difference, so that the light-emitting function layer 23 on one side of the anode pattern 22 away from the base substrate 10 can smoothly transition between adjacent anode patterns 22, and then the surface of the light-emitting function layer 23 is approximately flat, thereby better realizing uniformity of light emission of the display substrate.

It should be noted that comparing the display substrate provided in the embodiment of the present disclosure with the foregoing display substrate with anode units, the present disclosure is equivalent to connecting the argentum patterns included in various anode units in the same sub-pixel into one layer (i.e., serving as the reflective layer) and connecting lower ITO patterns included in various anode units in the same sub-pixel into one layer (i.e., serving as a bonding layer 25 mentioned later), or, removing lower ITO patterns included in various anode units in the same sub-pixel, providing an insulating layer 21 between the silver patterns and upper ITO patterns and taking the upper ITO patterns as the anode patterns 22. In this way, the height of the segment difference to be covered by the light-emitting function layer 23 is determined only by a thickness of the upper ITO pattern, thereby effectively increasing the distance between the edge portion of the anode pattern 22 and the cathode 24, and then greatly reducing the risk of leakage or short-circuiting between the edge portion of the anode pattern 22 and the cathode.

As shown in FIG. 3, in some embodiments, a thickness D1 of the anode pattern 22 in the direction perpendicular to the base substrate 10 satisfies: 100 Å≤D1≤1200 Å.

By setting the thickness D1 satisfying 100 Å≤D1≤1200 Å, it not only ensures conductivity of the anode pattern 22 and driving function of the anode pattern 22 to the light-emitting function layer 23, but also greatly reduces the height of the segment difference. In this way, a part of the light-emitting function layer 23 filled in the space area is reduced, and a thickness of another part of the light-emitting function layer 23 covering the edge portion of the anode pattern 22 is increased, thereby effectively increasing the distance between the edge portion of the anode pattern 22 and the cathode 24, and then greatly reducing the risk of leakage or short-circuiting between the edge portion of the anode pattern 22 and the cathode.

For example, when the light-emitting function layer 23 is a red light-emitting function layer, a thickness of the red light-emitting function layer in the direction perpendicular to the base substrate 10 is 328 nm. When the light-emitting function layer 23 is a green light-emitting function layer, a thickness of the green light-emitting function layer in the direction perpendicular to the base substrate 10 is 266 nm. When the light-emitting function layer 23 is a blue light-emitting function layer, a thickness of the blue light-emitting function layer in the direction perpendicular to the base substrate 10 is 226 nm. For example, a thickness of the cathode 24 is between 10 nm and 16 nm, which may include endpoint values.

Figure 5:
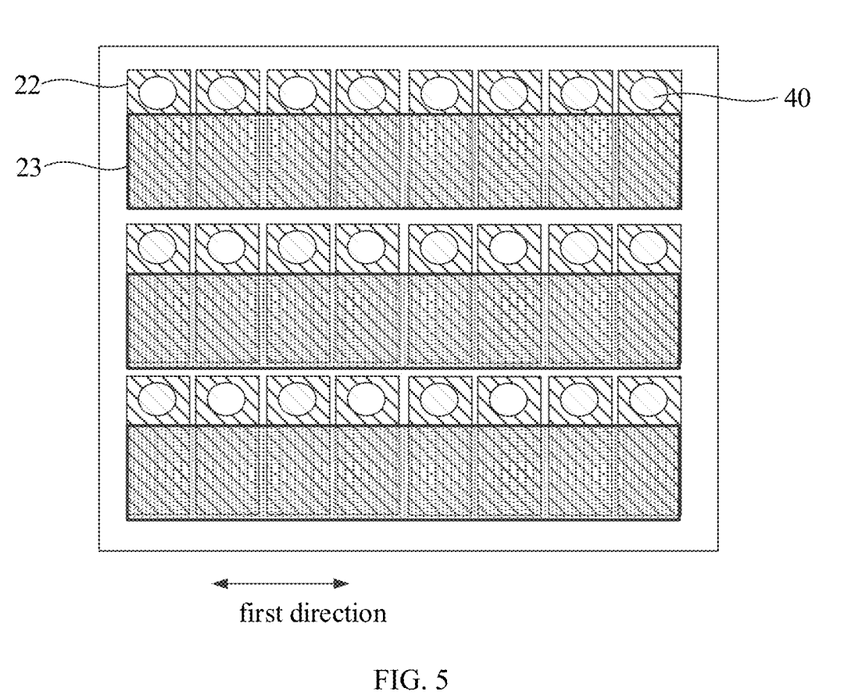
FIG. 5 is a schematic diagram of multiple sub-pixels according to an embodiment of the present disclosure.

As shown in FIG. 3 and FIG. 5, in some embodiments, the plurality of anode patterns 22 in the sub-pixel are arranged along the first direction. A shortest distance H between two adjacent sides of adjacent anode patterns 22 satisfies: 0.5 μm≤H≤1.5 μm.

For example, the first direction is a horizontal direction, i.e., a direction perpendicular to a thickness direction (which is perpendicular to the base substrate).

For example, the distance H is a minimum distance between the adjacent anode patterns 22 along the first direction.

For example, a manufacturing process of the multiple anode patterns 22 includes:
forming an anode transition layer via indium tin oxide material; forming a photoresist on the anode transition layer; exposing the photoresist to form a photoresist reserved area and a photoresist removed area, where the photoresist reserved area is corresponding to an area where the plurality of anode patterns 22 are located, and the photoresist removed area is corresponding to other areas except for the plurality of anode patterns 22; removing the photoresist in the photoresist reserved area to expose the anode transition layer located in the photoresist removed area; by taking the photoresist in the photoresist reserved area as a mask, performing a dry etching process on the exposed anode transition layer, to etch and remove the exposed anode transition layer, thereby forming the plurality of anode patterns 22.

It is worth noting that, as shown in FIG. 2, in the foregoing display substrate with the anode units 70, a minimum distance L between adjacent anode units 70 is generally between 3.5 μm and 4.5 μm.

In the plurality of anode patterns 22 produced by the dry etching process, the distance H between adjacent anode patterns 22 can be greatly reduced, and the distance H satisfies: 0.5 μm≤H≤1.5 μm, which is more conducive to realization of a continuous light-emitting surface in the sub-pixel.

Figure 4:
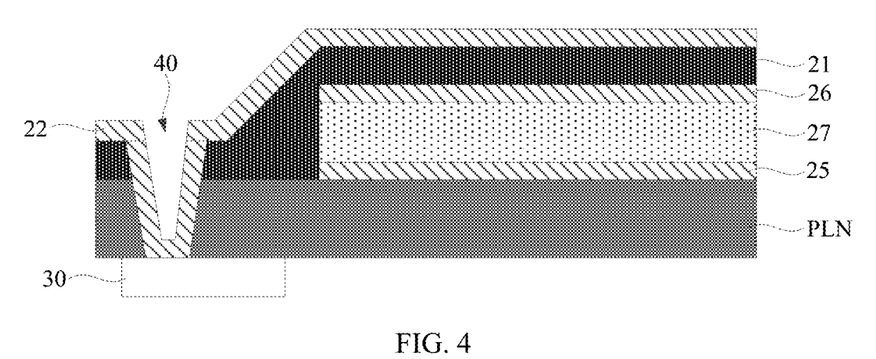
FIG. 4 is a schematic cross-sectional view of coupling between an anode pattern and a driving circuit according to an embodiment of the present disclosure.

As shown in FIG. 3 and FIG. 4, in some embodiments, the anode pattern 22 is a single-layer structure. The anode pattern is made of indium tin oxide.

For example, the anode pattern adopts a rectangular structure. A length of the anode pattern is between 5 μm and 32 μm, and a width of the anode pattern is between 3 μm and 14 μm, which may include endpoint values. For example, sizes of the anode pattern includes 17 μm×9 μm and 32 μm×14 μm.

For example, the sizes of multiple anode patterns included in the same sub-pixel may be the same or different.

For example, one sub-pixel may include multiple anode patterns, for example, including 2, 4, 8, 11, 14, 17, 20 anode patterns, and so on, which is not limited thereto.

The foregoing arrangement not only ensures the driving performance of the anode pattern 22, but also better reduces the thickness of the anode pattern 22, thereby effectively reducing the segment difference and then greatly reducing the risk of leakage or short-circuiting between the edge portion of the anode pattern 22 and the cathode 24.

In some embodiments, the insulating layer 21 includes a transparent insulating layer.

For example, a transmittance of the transparent insulating layer is greater than or equal to 85%.

The foregoing arrangement allows light rays emitted by the light-emitting function layer 23 to pass through the insulating layer 21 and be better reflected by the reflective layer 27 out of the display substrate, thereby effectively improving a light output rate of the display substrate.

As shown in FIG. 3 and FIG. 4, in some embodiments, the insulating layer 21 is made of inorganic materials.

For example, the insulating layer 21 includes a thinned planarization layer.

For example, the insulating layer 21 is made of inorganic materials such as $SiN_x$ or $SiO_x$.

For example, the insulating layer 21 is made of $Al_2O_3$.

The foregoing use of the inorganic material to fabricate the insulating layer 21 can not only ensure the insulating performance of the insulating layer 21, but also better control the thickness of the insulating layer 21, thereby better realize micro-cavity adjustment.

As shown in FIG. 3 and FIG. 4, in some embodiments, the thickness D2 of the insulating layer 21 in the direction perpendicular to the base substrate 10 satisfies: 200 Å≤D2≤1500 Å.

For example, the value of D2 may be 400 Å, 500 Å, or 700 Å.

It is worth noting that the reflective layer 27, the insulating layer 21, the plurality of anode patterns 22, the light-emitting function layer 23 and the cathode 24 together form an optical resonance micro-cavity. The optical resonance micro-cavity is configured to resonantly enhance light emitted by the light-emitting function layer 23 and reflect the light out of the display substrate, thereby improving the luminous efficiency of the display substrate.

It is worth noting that the thinner the thickness of the insulating layer 21 is, the more advantageous for modulation of the optical resonant micro-cavity.

By setting the thickness D2 to satisfying 200 Å≤D2≤1500 Å, it not only ensures good insulation performance of the insulating layer 21, but also facilitates the modulation of the optical resonant micro-cavity.

Figure 6:
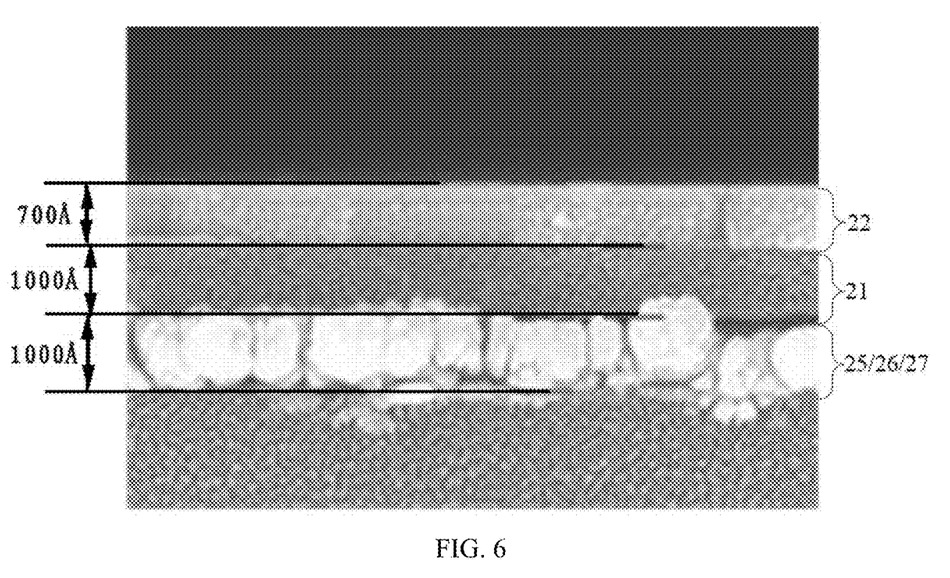
FIG. 6 is a first electron micrograph of a sub-pixel according to an embodiment of the present disclosure.
Figure 7:
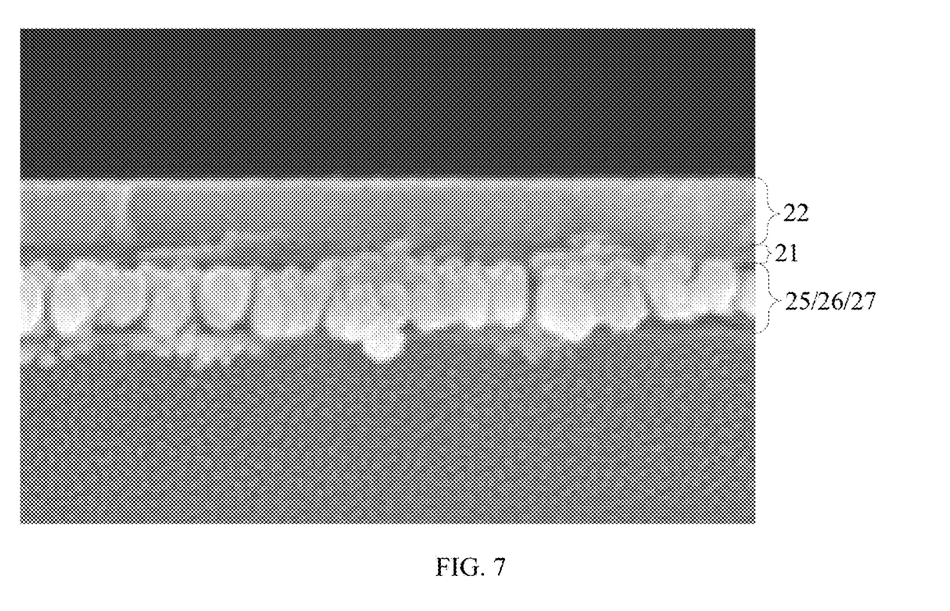
FIG. 7 is a second electron micrograph of a sub-pixel according to an embodiment of the present disclosure.

Specifically, referring to FIG. 6 and FIG. 7, FIG. 6 and FIG. 7 show electron micrographs of insulating layers 21 of two thicknesses. In FIG. 6 and FIG. 7, a thickness of the anode pattern 22 is 700 Å, and a total thickness of the bonding layer 25, the protection layer 26 and the reflective layer 27 is 1000 Å. In FIG. 6, the thickness of the insulating layer 21 is 1000 Å. In FIG. 7, the thickness of the insulating layer 21 is 200 Å.

As shown in FIG. 3 and FIG. 4, in some embodiments, the sub-pixel further includes a bonding layer 25. The bonding layer 25 is between the reflective layer 27 and the base substrate 10.

For example, the bonding layer 25 is made of indium tin oxide.

For example, the display substrate further includes a planarization layer (PLN). The planarization layer is between the base substrate 10 and the reflective layer 27. The bonding layer 25 is between the planarization layer and the reflective layer 27.

The presence of the bonding layer 25 can better enhance adhesion between the reflective layer 27 and the planarization layer, which helps to improve reliability of the display substrate.

As shown in FIG. 4, in some embodiments, the sub-pixel further includes a protection layer 26. The protection layer 26 is between the reflective layer 27 and the insulating layer 21.

For example, the protection layer 26 is made of indium tin oxide.

For example, the orthographic projection of the sub-pixel aperture area 20 onto the base substrate 10, an orthographic projection of the bonding layer 25 onto the base substrate 10, the orthographic projection of the reflective layer 27 onto the base substrate 10 and an orthographic projection of the protection layer 26 onto the base substrate 10 are all coincident with each other.

For example, each of the orthographic projection of the bonding layer 25 onto the base substrate 10, the orthographic projection of the reflective layer 27 onto the base substrate 10 and the orthographic projection of the protection layer 26 onto the base substrate 10 at least partially overlaps the orthographic projection of the sub-pixel aperture area 20 onto the base substrate 10.

For example, the orthographic projection of the sub-pixel aperture area 20 onto the base substrate 10 is within each of the orthographic projection of the bonding layer 25 onto the base substrate 10, the orthographic projection of the reflective layer 27 onto the base substrate 10 and the orthographic projection of the protection layer 26 onto the base substrate 10.

By disposing the protection layer 26 between the reflective layer 27 and the insulating layer 21, the protection layer 26 can protect the reflective layer 27 from being oxidized during the process of manufacturing the insulating layer 21, thereby better ensuring good reflection performance of the reflective layer 27.

As shown in FIG. 4, in some embodiments, the bonding layer 25, the protection layer 26 and the anode pattern 22 are made of the same material.

For example, the bonding layer 25, the protection layer 26 and the anode pattern 22 are all made of indium tin oxide.

For example, the thickness of each of the bonding layer 25 and the protection layer 26 is 80 Å, and the thickness of the reflective layer 27 is 1000 Å.

The foregoing arrangement allows the bonding layer 25, the protection layer 26 and the anode pattern 22 to be manufactured by the same equipment, thereby better saving manufacturing cost of the display substrate.

In some embodiments, the sub-pixel further includes:

a hole injection layer, a hole transport layer, an electron transport layer and an electron injection layer which are sequentially stacked in a direction away from the base substrate 10. The hole injection layer and the hole transport layer are both located between the light-emitting function layer 23 and the plurality of anode patterns 22. The electron transport layer and the electron injection layer are both located between the light-emitting function layer 23 and the cathode 24.

For example, each of the hole injection layer, the hole transport layer, the electron transport layer and the electron injection layer is an entire-film layer covering all sub-pixel regions in the display substrate.

In the display substrate provided in the foregoing embodiment, by providing the reflective layer 27, the insulating layer 21 and the multiple anode patterns 22, the segment difference generated by the anode pattern 22 is effectively reduced. In this way, when the hole injection layer, the hole transport layer, the electron transport layer and the electron injection layer are provided for covering the anode patterns 22, the probability of the hole injection layer, the hole transport layer, the electron transport layer and the electron injection layer being broken due to the segment difference is reduced, which is more conducive to transfer of carriers in other directions in addition to the direction perpendicular to the base substrate 10, so that more carriers can move obliquely upwards of the anode pattern 22, thereby further improving continuity of light emission between sub-subpixels.

Therefore, in the display substrate provided in the foregoing embodiment, the segment difference generated by the anode pattern 22 can be reduced by setting the distance H to satisfy: 0.5 μm≤H≤1.5 μm, thereby further improving continuity of light emission between sub-subpixels.

As shown in FIG. 4, in some embodiments, the sub-pixel further includes a driving circuit 30. The driving circuit 30 is located between the plurality of anode patterns 22 and the base substrate 10. The driving circuit 30 is configured to provide driving signals for the plurality of anode patterns 22, respectively.

The display substrate further includes a planarization layer (PLN). The driving circuit 30 is disposed between the planarization layer and the base substrate 10. The driving circuit 30 can independently provide driving signals for each anode pattern 22, thereby realizing independent grayscale control for multiple sub-pixels formed by multiple anode patterns 22.

In some embodiments, the driving circuit 30 includes a plurality of driving sub-circuits corresponding to the plurality of anode patterns 22 in a one-to-one manner. The driving sub-circuit is coupled to the corresponding anode pattern 22 through a via-hole structure 40, and is configured to provide a driving signal for the corresponding anode pattern 22.

For example, the driving sub-circuit includes a 6T1C structure, i.e., including six transistors and one capacitor. The driving sub-circuit includes a 7T1C structure, i.e., including seven transistors and one capacitor. For example, the driving sub-circuit includes a 2T1C structure, i.e., including two transistors and one capacitor. The driving sub-circuits of the 6T1C structure, the 7T1C structure and the 2T1C structure are all conventional structures, and will not be repeated here.

For example, the anode pattern 22 is located at one side of the corresponding driving sub-circuit away from the base substrate 10.

For example, the plurality of anode patterns 22 are arranged along the first direction. The plurality of driving sub-circuits corresponding to the plurality of anode patterns 22 are arranged along the first direction.

For example, when the driving sub-circuit includes a 7T1C structure, the driving sub-circuit includes a driving transistor and a light-emitting control transistor. A gate electrode of the light-emitting control transistor is coupled to a corresponding light-emitting control signal line (i.e., an EM line). An input electrode of the light-emitting control transistor is coupled to an output electrode of the driving transistor. An output electrode of the light-emitting control transistor is coupled to the corresponding anode pattern 22. For example, an orthographic projection of the output electrode of the light-emitting control transistor onto the base substrate 10 has an overlapping area with an orthographic projection of the corresponding anode pattern 22 onto the base substrate 10. The output electrode of the light-emitting control transistor is coupled to the corresponding anode pattern 22 through the via-hole structure 40 located in the overlapping area.

For example, when the driving sub-circuit includes a 2T1C structure, the driving sub-circuit includes a driving transistor. An output electrode of the driving transistor is coupled to the corresponding anode pattern 22. For example, an orthographic projection of the output electrode of the driving transistor onto the base substrate 10 has an overlapping area with the orthographic projection of the corresponding anode pattern 22 onto the base substrate 10. The output electrode of the driving transistor is coupled to the corresponding anode pattern 22 through the via-hole structure 40 located in the overlapping area.

In the display substrate provided in the foregoing embodiment, by setting the driving circuit 30 to include a plurality of driving sub-circuits corresponding to the plurality of anode patterns 22 in a one-to-one manner, each driving sub-circuit can independently provide driving signals for the corresponding anode pattern 22. Therefore, the display substrate can realize independent grayscale control for the multiple sub-subpixels formed by the multiple anode patterns 22. The display substrate not only meets the requirements for displaying multiple viewpoints in 3D, but also ensures a high-resolution 3D display effect, so that a resolution of 3D display will not be reduced compared with 2D display.

As shown in FIG. 4, in some embodiments, the driving circuit 30 includes driving sub-circuits and a plurality of control sub-circuits respectively coupled to the driving sub-circuits. The plurality of control sub-circuits are corresponding to the plurality of anode patterns 22 in a one-to-one manner. Each control sub-circuit is coupled to the corresponding anode pattern 22 through the corresponding via-hole structure 40. The plurality of control sub-circuits can turn on electrical connection between the driving sub-circuits and the corresponding anode patterns 22 in a time-sharing manner.

For example, the driving sub-circuit includes a 7T1C structure, i.e., including seven transistors and one capacitor. For example, the driving sub-circuit includes a 2T1C structure, i.e., including two transistors and one capacitor.

For example, the anode pattern 22 is located at one side of the corresponding control sub-circuit away from the base substrate 10.

For example, the plurality of anode patterns 22 are arranged along the first direction. The plurality of control sub-circuits corresponding to the plurality of anode patterns 22 are arranged along the first direction.

For example, the control sub-circuit includes a control transistor. A gate electrode of the control transistor is coupled to a corresponding light-emitting control signal line. An input electrode of the control transistor is coupled to the driving sub-circuit. An orthographic projection of an output electrode of the control transistor onto the base substrate 10 has an overlapping area with the orthographic projection of the corresponding anode pattern 22 onto the base substrate 10. The output electrode of the control transistor is coupled to the corresponding anode pattern 22 through the via-hole structure 40 located in the overlapping area.

For example, when the driving sub-circuit includes a 7T1C structure, the driving sub-circuit includes a driving transistor and a light-emitting control transistor. A gate electrode of the light-emitting control transistor is coupled to a corresponding light-emitting control signal line. An input electrode of the light-emitting control transistor is coupled to an output electrode of the driving transistor. Output electrodes of the light-emitting control transistors are coupled to the plurality of control sub-circuits, respectively.

For example, when the driving sub-circuit includes the 7T1C structure, the light-emitting control transistor included in the driving sub-circuit may be removed, and the output electrodes of the driving transistors included in the driving sub-circuits may be coupled to the plurality of control sub-circuits.

For example, when the driving sub-circuit includes the 2T1C structure, the driving sub-circuit includes a driving transistor. Output electrodes of the driving transistors are coupled to the plurality of control sub-circuits, respectively.

In the display substrate provided in the foregoing embodiment, by setting the driving circuit 30 to include driving sub-circuits and control sub-circuits respectively coupled to the driving sub-circuits, the driving circuit 30 can independently provide driving signals for each anode pattern 22. Therefore, the display substrate can realize independent grayscale control for the multiple sub-subpixels formed by the multiple anode patterns 22. The display substrate not only meets the requirements for displaying multiple view-points in 3D, but also ensures a high-resolution 3D display effect, so that a resolution of 3D display will not be reduced compared with 2D display.

As shown in FIG. 3, in some embodiments, the display substrate further includes a pixel defining layer 50. The pixel defining layer 50 is located at one side of the anode pattern 22 away from the base substrate 10. The pixel defining layer 50 defines a plurality of sub-pixel aperture areas 20. An orthographic projection of the pixel defining layer 50 onto the base substrate 10 at least partially overlaps an orthographic projection of the via-hole structure 40 onto the base substrate 10.

For example, after forming the plurality of anode patterns 22, the pixel defining layer 50 is formed. The pixel defining layer 50 defines a plurality of sub-pixel aperture areas 20.

For example, the orthographic projection of the pixel defining layer 50 onto the base substrate 10 overlaps with the orthographic projection of each anode pattern 22 onto the base substrate 10. For example, the plurality of anode patterns 22 are arranged along the first direction, and the orthographic projection of the pixel defining layer 50 onto the base substrate 10 partially overlaps an orthographic projection of a first end portion of each anode pattern 22 onto the base substrate 10. The orthographic projection of the pixel defining layer 50 onto the base substrate 10 partially overlaps an orthographic projection of a second end portion of each anode pattern 22 onto the base substrate 10. The first end portion and the second end portion of the anode pattern are opposed to each other along an extension direction of a long side of the anode pattern.

For example, the orthographic projection of the pixel defining layer 50 onto the base substrate 10 at least partially overlaps the orthographic projection of the via-hole structure 40 onto the base substrate 10. The pixel defining layer 50 is filled in the via-hole structure 40.

In the display substrate provided in the foregoing embodiment, the orthographic projection of the pixel defining layer 50 onto the base substrate 10 at least partially overlaps the orthographic projection of the via-hole structure 40 onto the base substrate 10, so that the pixel defining layer 50 can flatten a recess formed by the via-hole structure 40.

In some embodiments, the pixel defining layer 50 includes a first defining portion and a second defining portion. An orthographic projection of the first defining portion onto the base substrate 10 at least partially overlaps the orthographic projection of the via-hole structure 40 onto the base substrate 10. An orthographic projection of the second defining portion onto the base substrate 10 does not overlap the orthographic projection of the via-hole structure 40 onto the base substrate 10.

The orthographic projection of the cathode 24 onto the base substrate 10 does not overlap the orthographic projection of the first defining portion onto the base substrate 10. The orthographic projection of the cathode 24 onto the base substrate 10 at least partially overlaps the orthographic projection of the second defining portion onto the base substrate 10.

For example, the first defining portion and the second defining portion are formed as an integral structure.

For example, the first defining portion is located at two opposite sides of identical one pixel opening area, the second defining portion is located at two opposite sides of the identical one pixel opening area, and the first defining portion is adjacent to the second defining portion.

In some embodiments, the reflective layer 27 is located between the driving circuit and the pixel defining layer 50.

As shown in FIG. 4 and FIG. 5, in some embodiments, the via-hole structure 40 extends through the insulating layer 21. The orthographic projection of the via-hole structure 40 onto the base substrate 10 does not overlap the orthographic projection of the reflective layer 27 onto the base substrate 10.

For example, the display substrate further includes a planarization layer (PLN). The planarization layer is between the anode pattern 22 and the driving circuit 30. The via-hole structure 40 extends through the insulating layer 21 and the planarization layer.

With the foregoing arrangement that the orthographic projection of the via-hole structure 40 onto the base substrate 10 does not overlap the orthographic projection of the reflective layer 27 onto the base substrate 10, it prevents the anode pattern 22 from being short-circuited with the reflective layer 27 when connecting the anode pattern 22 to the driving circuit 30.

As shown in FIG. 5, in some embodiments, the via-hole structures 40 corresponding to the plurality of anode patterns 22 are arranged along the first direction.

It should be noted that FIG. 5 illustrates three sub-pixels which are arranged in a direction perpendicular to the first direction, and each sub-pixel includes a plurality of anode patterns 22.

The foregoing arrangement facilitates the pixel defining layer 50 to cover all the via-hole structures 40 corresponding to the plurality of anode patterns 22, thereby better ensuring the flatness of the display substrate.

In some embodiments, among the multiple anode patterns 22 included in identical one sub-pixel, via hole-holes corresponding to some of the anode patterns 22 are located at a first side of the anode patterns, via-holes corresponding to some of the anode patterns 22 are located at a second side of the anode patterns, and via-holes corresponding to some of the anode patterns 22 are located at a third side of the anode patterns. The first side and the second side of each anode pattern are opposite to each other, and the third side is adjacent to both of the first side and the second side.

One embodiment of the present disclosure further provides a display device, including the display substrate provided in the foregoing embodiments.

In the display substrate provided in the foregoing embodiment, the sub-pixel includes the reflective layer 27, the insulating layer 21 and the plurality of anode patterns 22, and each of the reflective layer 27 and the insulating layer 21 is an entire-layer structure under the plurality of anode patterns 22, so that the height of the segment difference between each anode pattern 22 and the space area is only related to the thickness of the anode pattern 22, and has nothing to do with the thickness of the insulating layer 21 and the reflective layer 27, thereby greatly reducing the height of the segment difference. In this way, a part of the light-emitting function layer 23 filled in the space area is reduced, and a thickness of another part of the light-emitting function layer 23 covering the edge portion of the anode pattern 22 is increased, thereby effectively increasing the distance between the edge portion of the anode pattern 22 and the cathode 24, and then greatly reducing the risk of leakage or short-circuiting between the edge portion of the anode pattern 22 and the cathode.

Further, the display substrate provided in the embodiment of the present disclosure effectively improves flatness of one side of the plurality of anode patterns 22 away from the base substrate 10 by greatly reducing the height of the segment difference, so that the surface of the light-emitting function layer 23 on one side of the anode pattern 22 away from the base substrate 10 is approximately flat, thereby better realizing uniformity of display brightness of the display substrate.

When the display device provided in the embodiment of the present disclosure includes the foregoing display substrate, the display device also has the foregoing beneficial effects, which will not be repeated here.

It should be noted that the display device may be any product or component with a display function, such as a TV, a monitor, a digital photo frame, a mobile phone, a tablet computer.

One embodiment of the present disclosure further provides a method for manufacturing the display substrate provided in the foregoing embodiment. As shown in FIG. 3, the method includes: fabricating a plurality of sub-pixels on a base substrate 10, where the sub-pixel includes a sub-pixel aperture area 20. The step of fabricating the sub-pixels specifically includes:

fabricating a reflective layer 27, where an orthographic projection of the reflective layer 27 onto the base substrate 10 at least partially overlaps an orthographic projection of the sub-pixel aperture area 20 onto the base substrate 10;

fabricating an insulating layer 21 on one side of the reflective layer 27 away from the base substrate 10;

fabricating a plurality of anode patterns 22 independent of each other, where the plurality of anode patterns 22 are on one side of the insulating layer 21 away from the base substrate 10, an orthographic projection of each anode pattern 22 onto the base substrate 10 at least partially overlaps the orthographic projection of the sub-pixel aperture area 20 onto the base substrate 10;

fabricating a light-emitting function layer 23, where the light-emitting function layer 23 is on one side of the anode patterns 22 away from the base substrate 10, and an orthographic projection of the light-emitting function layer 23 onto the base substrate 10 at least partially overlaps the orthographic projection of the sub-pixel aperture area 20 onto the base substrate 10;

fabricating a cathode 24 on one side of the light-emitting function layer 23 away from the base substrate 10; where an orthographic projection of the cathode 24 onto the base substrate 10 covers the orthographic projection of the light-emitting function layer 23 onto the base substrate 10, an orthographic projection of a first portion of the cathode 24 onto the base substrate 10 is located within the orthographic projection of the sub-pixel aperture area 20 onto the base substrate 10; there is a segment difference in a surface of the first portion away from the base substrate 10; in a direction perpendicular to the base substrate 10, a height of the segment difference is less than or equal to a thickness of the anode pattern 22.

For example, the base substrate 10 includes a flexible substrate or a rigid substrate.

For example, the reflective layer 27 is made of a metal material, such as metallic silver. For example, the orthographic projection of the sub-pixel aperture area 20 onto the base substrate 10 is located within the orthographic projection of the reflective layer 27 onto the base substrate 10. For example, the orthographic projection of the sub-pixel aperture area 20 onto the base substrate 10 is surrounded by the orthographic projection of the reflective layer 27 onto the base substrate 10.

For example, the insulating layer 21 includes a passivation layer. For example, the insulating layer 21 completely covers the reflective layer 27, and the insulating layer 21 can insulate the reflective layer 27 from the plurality of anode patterns 22. For example, the orthographic projection of the sub-pixel aperture area 20 onto the base substrate 10 is located within the orthographic projection of the insulating layer 21 onto the base substrate 10. For example, the orthographic projection of the sub-pixel aperture area 20 onto the base substrate 10 is surrounded by the orthographic projection of the insulating layer 21 onto the base substrate 10.

For example, the insulating layer 21 is formed by deposition of inorganic materials.

For example, the plurality of anode patterns 22 are made of the same material, and the plurality of anode patterns 22 can be formed simultaneously in a patterning process. For example, the anode pattern 22 is a single-layer pattern made of a single material. For example, the plurality of anode patterns 22 are arranged along a first direction. For example, the plurality of anode patterns 22 are distributed in an array. For example, the plurality of anode patterns 22 are uniformly distributed. For example, a space area is formed between adjacent anode patterns 22. A height of the segment difference formed between each anode pattern 22 and its surrounding space area, is related to a thickness of the anode pattern 22 in a direction perpendicular to the base substrate 10.

For example, each of orthographic projections of the plurality of anode patterns 22 onto the base substrate 10 overlaps the orthographic projections of the sub-pixel aperture areas 20 onto the base substrate 10. For example, orthographic projections of a part of the plurality of anode patterns 22 onto the base substrate 10 are located within the orthographic projection of the sub-pixel aperture area 20 onto the base substrate 10, and orthographic projections of other part of the plurality of anode patterns 22 onto the base substrate 10 partially overlaps the orthographic projection of the sub-pixel aperture area 20 onto the base substrate 10.

For example, the light-emitting function layer 23 is made of an organic light-emitting material. For example, the orthographic projection of the light-emitting function layer 23 onto the base substrate 10 coincides with the orthographic projection of the sub-pixel aperture area 20 onto the base substrate 10. For example, the light-emitting function layer 23 covers at least a part of each of the anode patterns 22 and is filled in the space area between adjacent anode patterns 22.

For example, the cathode 24 is an entire-layer structure covering each sub-pixel aperture area 20. For example, the cathode 24 is made of a metal material.

In the display substrate manufactured by the method provided in the embodiment of the present disclosure, the sub-pixel includes the reflective layer 27, the insulating layer 21 and the plurality of anode patterns 22, and each of the reflective layer 27 and the insulating layer 21 is an entire-layer structure under the plurality of anode patterns 22, so that the height of the segment difference between each anode pattern 22 and the space area is only related to the thickness of the anode pattern 22, and has nothing to do with the thickness of the insulating layer 21 and the reflective layer 27, thereby greatly reducing the height of the segment difference. In this way, a part of the light-emitting function layer 23 filled in the space area is reduced, and a thickness of another part of the light-emitting function layer 23 covering the edge portion of the anode pattern 22 is increased, thereby effectively increasing the distance between the edge portion of the anode pattern 22 and the cathode 24, and then greatly reducing the risk of leakage or short-circuiting between the edge portion of the anode pattern 22 and the cathode.

Further, the display substrate manufactured by the method provided in the embodiment of the present disclosure effectively improves flatness of one side of the plurality of anode patterns 22 away from the base substrate 10 by greatly reducing the height of the segment difference, so that the surface of the light-emitting function layer 23 on one side of the anode pattern 22 away from the base substrate 10 is approximately flat, thereby better realizing uniformity of display brightness of the display substrate.

As shown in FIG. 3, in some embodiments, the step of fabricating a plurality of anode patterns 22 independent of each other, specifically includes:

fabricating an anode transition layer;
using a dry etching process to etch the anode transition layer to form a plurality of anode patterns 22 independent of each other.

For example, a manufacturing process of the plurality of anode patterns 22 includes:
forming an anode transition layer via indium tin oxide material; forming a photoresist on the anode transition layer; exposing the photoresist to form a photoresist reserved area and a photoresist removed area, where the photoresist reserved area is corresponding to an area where the plurality of anode patterns 22 are located, and the photoresist removed area is corresponding to other areas except for the plurality of anode patterns 22; removing the photoresist in the photoresist reserved area to expose the anode transition layer located in the photoresist removed area; by taking the photoresist in the photoresist reserved area as a mask, performing a dry etching process on the exposed anode transition layer, to etch and remove the exposed anode transition layer, thereby forming the plurality of anode patterns 22.

In the plurality of anode patterns 22 produced by the dry etching process, the distance H between adjacent anode patterns 22 can be greatly reduced, and the distance H satisfies: $0.5 \ \mu m \leq H \leq 1.5 \ \mu m$, which is more conducive to realization of a continuous light-emitting surface in the sub-pixel.

It should be noted that the various embodiments in this specification are described in a progressive manner, and the same or similar parts between the various embodiments can be referred to each other, and each embodiment focuses on differences from other embodiments. In particular, for the method embodiment, since it is basically similar to the product embodiment, the description is relatively simple, and the relevant part can refer to the part of the description of the product embodiment.

Unless otherwise defined, the technical or scientific terms used in the present disclosure shall have the ordinary meanings understood by those of ordinary skill in the art to which the present disclosure belongs. The terms "first", "second", and the like used in this disclosure do not indicate any order, quantity, or priority, but are only used to distinguish different components. The terms "include", "have" or any variations thereof are intended to mean that an element or article followed by such a term encompasses a list of elements or articles preceded by such a term, or equivalents thereof, without precluding other elements or articles. Expressions such as "connection" or "connected" are not limited to physical or mechanical connections, but may include electrical connections, whether direct or indirect. Such words as "on", "under", "left" and "right" are merely used to represent relative position relationship, and when an absolute position of the object is changed, the relative position relationship will be changed too.

It will be understood that when an element, such as a layer, film, area or substrate, is referred to as being "on" or "under" another element, it can be directly on or directly under the other element, or intervening elements may also be present.

In the descriptions of this specification, specific features, structures, materials, or characteristics may be combined in a suitable manner in any one or more embodiments or examples.

The above descriptions are merely some embodiments of the present disclosure. It should be noted that for those of ordinary skill in the art, without departing from the principles of the present disclosure, various improvements and modifications can be made. These improvements and modifications should fall within the protection scope of the present disclosure.

What is claimed is:

1. A display substrate, comprising:
   a base substrate; and
   a plurality of sub-pixels on the base substrate;
   wherein each sub-pixel of the plurality of sub-pixels includes a sub-pixel aperture area; each sub-pixel of the plurality of sub-pixels further includes:
      a reflective layer, wherein an orthographic projection of the reflective layer onto the base substrate at least partially overlaps an orthographic projection of the sub-pixel aperture area onto the base substrate;
      an insulating layer on one side of the reflective layer away from the base substrate;
      a plurality of anode patterns independent of each other, wherein the plurality of anode patterns are on one side of the insulating layer away from the base substrate, and each of orthographic projections of the plurality of anode patterns onto the base substrate at least partially overlaps the orthographic projection of the sub-pixel aperture area onto the base substrate;
      a light-emitting function layer on one side of the plurality of anode patterns away from the base substrate, wherein an orthographic projection of the light-emitting function layer onto the base substrate at least partially overlaps the orthographic projection of the sub-pixel aperture area onto the base substrate; and
      a cathode on one side of the light-emitting function layer away from the base substrate, wherein an orthographic projection of the cathode onto the base substrate covers the orthographic projection of the light-emitting function layer onto the base substrate; an orthographic projection of a first portion of the cathode onto the base substrate is located within the orthographic projection of the sub-pixel aperture area onto the base substrate; there is a segment difference in a surface of the first portion away from the base substrate; in a direction perpendicular to the base substrate, a height of the segment difference is less than or equal to a thickness of the plurality of anode patterns.

2. The display substrate according to claim 1, wherein a thickness D1 of the plurality of anode patterns in the direction perpendicular to the base substrate satisfies: $100 \text{ Å} \leq D1 \leq 1200 \text{ Å}$.

3. The display substrate according to claim 1, wherein the plurality of anode patterns in each sub-pixel of the plurality of sub-pixels are arranged along a first direction; and a shortest distance H between two adjacent sides of adjacent anode patterns satisfies: $0.5 \text{ μm} \leq H \leq 1.5 \text{ μm}$.

4. The display substrate according to claim 1, wherein the plurality of anode patterns is a single-layer structure, and the plurality of anode patterns is made of indium tin oxide.

5. The display substrate according to claim 1, wherein the insulating layer includes a transparent insulating layer.

6. The display substrate according to claim 1, wherein the insulating layer is made of an inorganic material.

7. The display substrate according to claim 1, wherein a thickness D2 of the insulating layer in a direction perpendicular to the base substrate satisfies: $200 \text{ Å} \leq D2 \leq 1500 \text{ Å}$.

8. The display substrate according to claim 1, wherein each of the plurality of sub-pixels further includes a bonding layer, and the bonding layer is between the reflective layer and the base substrate;
   wherein each sub-pixel of the plurality of sub-pixels further includes a protection layer, and the protection layer is between the reflective layer and the insulating layer.

9. The display substrate according to claim 8, wherein the bonding layer, the protection layer, and the anode pattern are made of the same material.

10. The display substrate according to claim 1, wherein each sub-pixel of the plurality of sub-pixels further includes: a hole injection layer, a hole transport layer, an electron transport layer, and an electron injection layer which are sequentially stacked in a direction away from the base substrate;
    wherein the hole injection layer and the hole transport layer are both located between the light-emitting function layer and the plurality of anode patterns; and the electron transport layer and the electron injection layer are both located between the light-emitting function layer and the cathode.

11. The display substrate according to claim 1, wherein each sub-pixel of the plurality of sub-pixels further includes a driving circuit; the driving circuit is between the plurality of anode patterns and the base substrate; and the driving circuit is configured to provide driving signals for each anode pattern of the plurality of anode patterns.

12. The display substrate according to claim 11, wherein the driving circuit includes a plurality of driving sub-circuits corresponding to the plurality of anode patterns in a one-to-one manner; each driving sub-circuit is coupled to a corresponding anode pattern through a via-hole structure, and is configured to provide a driving signal for the corresponding anode pattern.

13. The display substrate according to claim 12, wherein the display substrate further includes a pixel defining layer; the pixel defining layer is located at one side of the plurality of anode patterns away from the base substrate; the pixel defining layer defines a plurality of sub-pixel aperture areas including the sub-pixel aperture area; an orthographic projection of the pixel defining layer onto the base substrate at least partially overlaps an orthographic projection of the via-hole structure onto the base substrate.

14. The display substrate according to claim 13, wherein the pixel defining layer includes a first defining portion and a second defining portion; an orthographic projection of the first defining portion onto the base substrate at least partially overlaps the orthographic projection of the via-hole structure onto the base substrate; an orthographic projection of the second defining portion onto the base substrate does not overlap the orthographic projection of the via-hole structure onto the base substrate;
    the orthographic projection of the cathode onto the base substrate does not overlap the orthographic projection of the first defining portion onto the base substrate; and the orthographic projection of the cathode onto the base substrate at least partially overlaps the orthographic projection of the second defining portion onto the base substrate.

15. The display substrate according to claim 13, wherein the reflective layer is located between the driving circuit and the pixel defining layer.

16. The display substrate according to claim 12, wherein the via-hole structure extends through the insulating layer; and the orthographic projection of the via-hole structure onto the base substrate does not overlap the orthographic projection of the reflective layer onto the base substrate;
wherein the via-hole structures corresponding to the plurality of anode patterns are arranged along a first direction.

17. The display substrate according to claim 11, wherein the driving circuit includes driving sub-circuits and a plurality of control sub-circuits respectively coupled to the driving sub-circuits; the plurality of control sub-circuits correspond to the plurality of anode patterns in a one-to-one manner; each control sub-circuit is coupled to a corresponding anode pattern through a corresponding via-hole structure; the plurality of control sub-circuits are configured to turn on electrical connection between the driving sub-circuits and the corresponding anode patterns in a time-sharing manner.

18. A display device, comprising the display substrate according to claim 1.

19. A method for manufacturing a display substrate, comprising:
fabricating a plurality of sub-pixels on a base substrate, wherein each sub-pixel of the plurality of sub-pixels includes a sub-pixel aperture area;
wherein the step of fabricating the plurality of sub-pixels specifically includes:
fabricating a reflective layer, wherein an orthographic projection of the reflective layer onto the base substrate at least partially overlaps an orthographic projection of the sub-pixel aperture area onto the base substrate;
fabricating an insulating layer on one side of the reflective layer away from the base substrate;
fabricating a plurality of anode patterns independent of each other, wherein the plurality of anode patterns are on one side of the insulating layer away from the base substrate, an orthographic projection of each anode pattern onto the base substrate at least partially overlaps the orthographic projection of the sub-pixel aperture area onto the base substrate;
fabricating a light-emitting function layer, wherein the light-emitting function layer is on one side of the anode patterns away from the base substrate, and an orthographic projection of the light-emitting function layer onto the base substrate at least partially overlaps the orthographic projection of the sub-pixel aperture area onto the base substrate; and
fabricating a cathode on one side of the light-emitting function layer away from the base substrate; wherein an orthographic projection of the cathode onto the base substrate covers the orthographic projection of the light-emitting function layer onto the base substrate, an orthographic projection of a first portion of the cathode onto the base substrate coincides with the orthographic projection of the sub-pixel aperture area onto the base substrate; there is a segment difference in a surface of the first portion away from the base substrate; in a direction perpendicular to the base substrate, a height of the segment difference is less than or equal to a thickness of the plurality of anode patterns.

20. The method according to claim 19, wherein the step of fabricating a plurality of anode patterns independent of each other, specifically includes:
fabricating an anode transition layer; and
using a dry etching process to etch the anode transition layer to form the plurality of anode patterns independent of each other.

* * * * *